(12) United States Patent
Greeff

(10) Patent No.: US 10,340,913 B2
(45) Date of Patent: *Jul. 2, 2019

(54) APPARATUSES AND METHODS FOR PARTIAL BIT DE-EMPHASIS

(71) Applicant: MICRON TECHNOLOGY, INC., Boise, ID (US)

(72) Inventor: Roy E. Greeff, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 16/130,900

(22) Filed: Sep. 13, 2018

(65) Prior Publication Data

US 2019/0013809 A1 Jan. 10, 2019

Related U.S. Application Data

(63) Continuation of application No. 15/941,964, filed on Mar. 30, 2018, which is a continuation of application
(Continued)

(51) Int. Cl.
*H03K 19/00* (2006.01)
*H03K 19/003* (2006.01)
(Continued)

(52) U.S. Cl.
CPC ....... *H03K 19/0005* (2013.01); *H03K 5/1534* (2013.01); *H03K 19/00323* (2013.01); *H03K 19/018521* (2013.01); *H04L 25/0286* (2013.01)

(58) Field of Classification Search
CPC ............. H03K 19/0005; H03K 5/1534; H03K 19/00323; H03K 19/018521
(Continued)

(56) References Cited

U.S. PATENT DOCUMENTS

| 6,704,818 B1 | 3/2004 | Martin et al. |
| 6,744,287 B2 | 6/2004 | Mooney et al. |

(Continued)

FOREIGN PATENT DOCUMENTS

WO 2016188287 A1 12/2016

OTHER PUBLICATIONS

International Search Report and Written Opinion dated Jun. 27, 2018 for PCT Application No. PCT/US2018/022852, 3 pages.
(Continued)

*Primary Examiner* — Dylan C White
(74) *Attorney, Agent, or Firm* — Dorsey & Whitney LLP

(57) ABSTRACT

Apparatuses and methods for partial bit de-emphasis are provided. An example apparatus includes an output driver and control circuit. The output driver includes a pull-up circuit including one or more pull-up legs, and a pull-down circuit including one or more pull-down legs. The control circuit may be coupled to the output driver and configured to receive an input signal having a first logical value and a second logical value, and in response to determining the logical transition has occurred from the second logic value to the first logic value, cause the pull-up circuit and pull-down circuit respectively to enter a first state for a duration of a first portion of a bit period and to enter a second state for a duration of a second portion of the bit period preceding the first portion.

23 Claims, 7 Drawing Sheets

Related U.S. Application Data

No. 15/464,012, filed on Mar. 20, 2017, now Pat. No. 9,948,300.

(51) Int. Cl.
*H03K 19/0185* (2006.01)
*H03K 5/1534* (2006.01)
*H04L 25/02* (2006.01)

(58) Field of Classification Search
USPC .......................................................... 326/30
See application file for complete search history.

(56) References Cited

U.S. PATENT DOCUMENTS

| | | | |
|---|---|---|---|
| 7,227,382 B1 | 6/2007 | Talbot et al. | |
| 9,048,824 B2 | 6/2015 | Chan et al. | |
| 9,479,146 B1 | 10/2016 | Cho | |
| 9,948,300 B1* | 4/2018 | Greeff | H03K 19/0005 |
| 10,128,843 B2 | 11/2018 | Greeff | |
| 2009/0015298 A1* | 1/2009 | Saitou | H03K 5/04 327/108 |
| 2012/0049897 A1* | 3/2012 | Kubo | H04L 25/0274 327/108 |
| 2013/0043900 A1 | 2/2013 | Hollis et al. | |
| 2013/0147532 A1 | 6/2013 | Song | |
| 2014/0292390 A1 | 10/2014 | Baek | |
| 2014/0375355 A1 | 12/2014 | Saito | |
| 2016/0359553 A1 | 12/2016 | Won | |
| 2017/0170831 A1* | 6/2017 | Lim | H03K 19/00384 |
| 2017/0264283 A1* | 9/2017 | Tan | H03K 17/162 |
| 2018/0047328 A1 | 2/2018 | Kim et al. | |
| 2018/0269875 A1 | 9/2018 | Greeff | |

OTHER PUBLICATIONS

Office Action for TW application No. 107109320 dated Feb. 19, 2019, pp. all.

* cited by examiner

APPARATUSES AND METHODS FOR PARTIAL BIT DE-EMPHASIS

CROSS-REFERENCE TO RELATED APPLICATION(S)

This application is a continuation of U.S. patent application Ser. No. 15/941,964, filed Mar. 30, 2018, and issued as U.S. Pat. No. 10,128,843 on Sep. 20, 2018, which is a continuation of U.S. application Ser. No. 15/464,012, filed Mar. 20, 2017, and issued as U.S. Pat. No. 9,948,300 on Apr. 17, 2018. The aforementioned applications and patents are incorporated by reference herein, in their entirety, and for all purposes.

BACKGROUND

Digital systems, such as memory devices, continue to operate at higher and higher speeds. Various signal lines that carry digital signals may exhibit low-pass filter (LPF) characteristics, either due to increasing channel loss with frequency, or through capacitive filtering. Thus, the maximum data rate supported by a channel becomes limited.

To compensate for LPF effects of a channel, various equalization techniques have been used. Typically, an equalizer circuit with a high pass frequency response may be provided. When a low pass channel is matched with a high pass equalizer, the overall frequency response may be flattened. One conventional approach to equalization includes modification of the signal line to make the signal line less capacitive, or modification of the signal to be less affected by capacitance, for example, by inserting repeaters or inverters on the signal line.

Another approach involves modification of the shape of a transmitted signal such that the capacitance of the signal line causes the transmitted signal to be received with a desired shape, for example, by pre-emphasis or de-emphasis. Pre-emphasis refers to increasing the amplitude of a digital signal by providing, at every bit transition, an overshoot that becomes filtered by the capacitive effects of the signal line.

De-emphasis refers to a complementary process of decreasing the amplitude of a digital signal, where at every bit transition a full rail-to-rail swing between a high supply voltage (VDDQ, VDD) and low supply voltage (VSSQ, VSS) is provided. However, in the case of de-emphasis, the full swing may overshoot the decreased amplitude of a bit-value. For example, after a transition, a first bit may have a maximum amplitude for the entire bit period. If the bit is repeated (has the same bit value), subsequent repeated bits may be de-emphasized.

One conventional way to implement de-emphasis/pre-emphasis is to utilize a delay chain to sequentially turn on or turn off the legs of a pull-up and/or pull-down circuit of a voltage driver. This causes a dynamic change in the driver output impedance, which can degrade signal integrity. Furthermore, de-emphasis/pre-emphasis is typically asymmetric, either strengthening pull-up from VSSQ or pull-down from VDDQ.

Thus, an apparatus and method for an improved signal integrity and control in bit de-emphasis is provided.

BRIEF DESCRIPTION OF THE DRAWINGS

A further understanding of the nature and advantages of particular embodiments may be realized by reference to the remaining portions of the specification and the drawings, in which like reference numerals are used to refer to similar components. In some instances, a sub-label is associated with a reference numeral to denote one of multiple similar components. When reference is made to a reference numeral without specification to an existing sub-label, it is intended to refer to all such multiple similar components.

DETAILED DESCRIPTION

The following detailed description illustrates a few exemplary embodiments in further detail to enable one of skill in the art to practice such embodiments. The described examples are provided for illustrative purposes and are not intended to limit the scope of the invention. In the following description, for the purposes of explanation, numerous specific details are set forth in order to provide a thorough understanding of the described embodiments. It will be apparent to one skilled in the art, however, that other embodiments of the present invention may be practiced without some of these specific details.

Several embodiments are described herein, and while various features are ascribed to different embodiments, it should be appreciated that the features described with respect to one embodiment may be incorporated with other embodiments as well. By the same token, however, no single feature or features of any described embodiment should be considered essential to every embodiment of the invention, as other embodiments of the invention may omit such features.

Unless otherwise indicated, all numbers herein used to express quantities, dimensions, and so forth, should be understood as being modified in all instances by the term "about." In this application, the use of the singular includes the plural unless specifically stated otherwise, and use of the terms "and" and "or" means "and/or" unless otherwise indicated. Moreover, the use of the term "including," as well as other forms, such as "includes" and "included," should be considered non-exclusive. Also, terms such as "element" or "component" encompass both elements and components comprising one unit and elements and components that comprise more than one unit, unless specifically stated otherwise.

Figure 1:
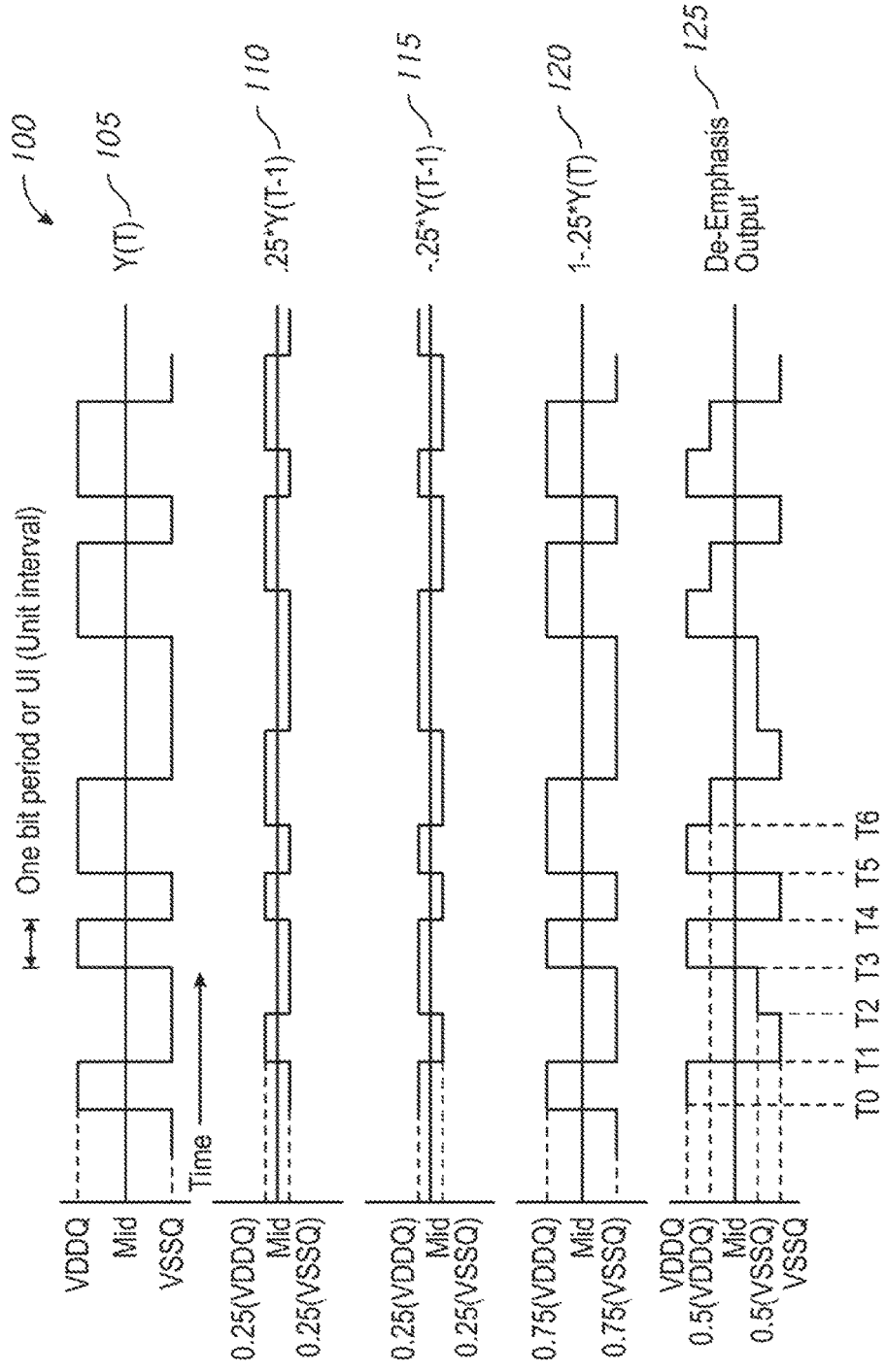
FIG. 1 is a timing diagram showing prior art de-emphasis operation.

FIG. 1 is a timing diagram 100 of prior art de-emphasis, which will be described herein for conceptual explanation. The timing diagram 100 includes schematic illustrations of an input digital signal Y(T) 105, a delayed version of the input digital signal with 0.25 amplitude 0.25*Y(T−1) 110, an inverse delayed version of the input digital signal with 0.25 amplitude −0.25*Y(T−1) 115, the input digital signal with 0.75 amplitude 1−0.25*Y(T) 120, and the de-emphasis output 125.

Times T0, T1, T2, T3, T4, T5, and T6 each correspond to consecutive bit periods. Thus, as depicted, at T0, Y(T) 105 transitions from a logic low, VSSQ, to a logic high, VDDQ. In the embodiments depicted, VDDQ corresponds to full amplitude logic high and VSSQ corresponds to full amplitude logic low. At time T1, Y(T) 105 transitions from logic high to logic low. At time T2, Y(T) 105 repeats a logic low bit. At time T3, Y(T) 105 transitions from logic low to logic high, at time T4 transitions from logic high to logic low, at time T5 transitions from logic low to logic high, and at time T6 repeats a logic high bit.

The waveform 0.25*Y(T−1) 110 depicts the digital signal Y(T) 105 with 0.25 amplitude, and delayed by one full bit period. The waveform −0.25*Y(T−1) 115 depicts the inverse waveform of 0.25*Y(T−1) 110. 1−0.25*Y(T) 120 depicts the digital signal Y(T) 105 with 0.75 amplitude. In some cases, to obtain a 0.5 amplitude de-emphasis, the 1−0.25*Y(T) 120 may be combined with the 0.25*Y(T−1) 110 waveform at differential adder, subtracting the 0.25*Y(T−1) 110 from the 1−0.25*Y(T) 120 waveform. Alternatively, 1−0.25*Y(T) 120 may be combined with −0.25*Y(T−1) 115 at an adder, achieving the same result.

As can be seen at the de-emphasis output 125, each time a transition occurs, the de-emphasis output 125 undergoes a full amplitude swing. For example, at time T1 the waveform transitions from VDDQ to VSSQ. At time T2, when a logic low bit is repeated in the digital signal Y(T) 105, the subsequent bit is de-emphasized to have 0.5 amplitude of 0.5 (VSSQ). At time T3, when the signal Y(T) 105 transitions to a logic high bit, the de-emphasis output 125 undergoes a full amplitude swing, this case to VDDQ. Similarly, for repeated logic high bits, at time T6, the repeated bit of the de-emphasis output 125 is de-emphasized to an amplitude of 0.5 (VDDQ).

A delay of a full bit period is depicted for illustrative purposes only. As previously described, by providing an adjustable delay interval that is less than one bit period, the digital signal may be de-emphasized for only a partial bit period. For example, if −0.25*Y(T−1) 115 were instead delayed only by 0.5 of a bit period, the de-emphasis output 125 would only show that each bit after a transition having at a full amplitude for only half of the bit period, and a de-emphasized after half of the bit period, having a full amplitude for the second half of the bit period. When a bit is repeated in the digital signal Y(T) 105, the subsequent bit would maintain the same de-emphasis amplitude for the full bit period.

In contrast with prior art de-emphasis techniques, partial bit de-emphasis allows a signal to be de-emphasized for at least part of a single bit period. Conventional de-emphasis causes de-emphasis of a signal over entire bit periods, whereas the following embodiments utilizing partial bit de-emphasis allow control over a de-emphasis time that is less than a full bit period, as well as a de-emphasis amplitude. This is described in greater detail with respect to the embodiments below.

Figure 2:
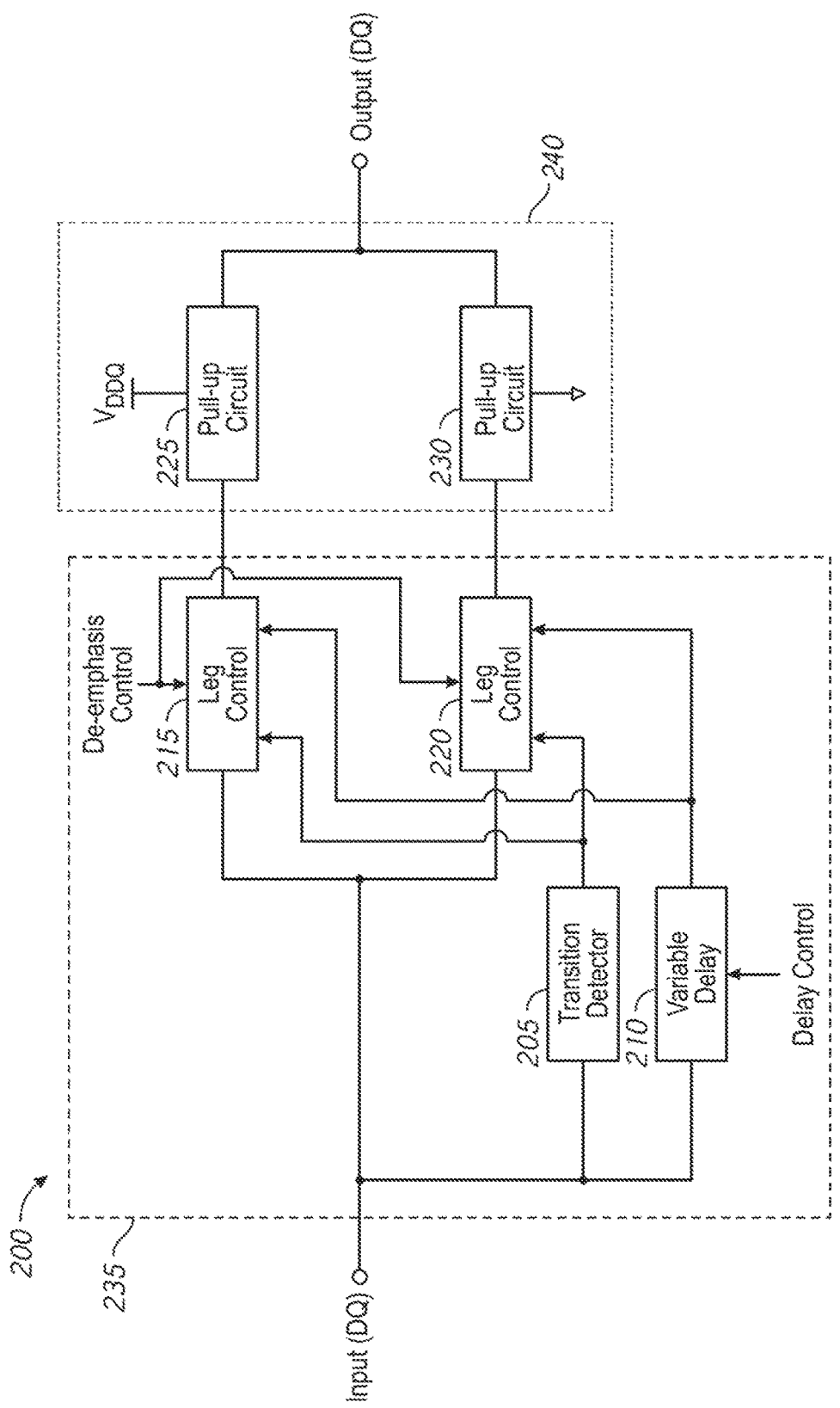
FIG. 2 is a schematic block diagram of an output circuit with partial bit de-emphasis, in accordance with various embodiments.

FIG. 2 illustrates a schematic block diagram of an output circuit 200 configured to perform partial bit de-emphasis, according to various embodiments. Generally speaking, FIG. 2 illustrates an output circuit 200 that provides partial bit de-emphasis through a de-emphasis control circuit 235 that is coupled to an output driver 240 that includes pull-up circuit 225 and pull-down circuit 230. Conceptually, partial bit de-emphasis allows adjustment of a de-emphasis time, in addition to amplitude adjustment. As discussed previously, conventional de-emphasis causes a given bit to have a modified amplitude for an entire bit period. In other words, a bit following a transition has full amplitude for the entire bit period, and a repeated bit will be de-emphasized for its respective full bit period. Partial bit de-emphasis allows a bit to be de-emphasized for partial times of a bit period, and for the partial times to be adjusted. The partial times of a bit period can be referred to as a de-emphasis time. In some embodiments, de-emphasis time may refer to the length of time that a given bit is de-emphasized in a given bit period. For example, in some embodiments, the de-emphasis time may be adjusted anywhere from 0% of the bit period to 100% of the bit period. In some embodiments, de-emphasis time may be continuously adjustable, whereas in other embodiments, adjustment of the de-emphasis time may be discrete or stepped. As de-emphasis time increases, a digital signal may be equalized over a greater bandwidth, while the amplitude of an output signal may decrease.

The de-emphasis control circuit 235 may include a transition detector circuit 205, variable delay circuit 210, pull-up leg control circuit 215, and pull-down leg control circuit 220. The de-emphasis control circuit 235 may in turn be coupled to a pull-up circuit 225, and pull-down circuit 230 of the output driver 240. In some embodiments, an input of the output circuit 200 may receive a digital signal for partial bit de-emphasis. The output circuit 200 may provide the digital signal, from the input, to each of the transition detector circuit 205, variable delay circuit 210, pull-up leg control circuit 215, and pull-down leg control circuit 220. In some embodiments, the de-emphasis control circuit 235 may include all or part of an equalizer circuit. For example, in some embodiments, the de-emphasis control circuit 235 may act as a finite impulse response filter configured to cause partial bit de-emphasis of the digital signal.

The transition detector 205 may be configured to detect when the digital signal undergoes a logical transition, for example, from a logic high (e.g., VDDQ or VDD) to a logic low (e.g., VSSQ or VSS), and from logic low to logic high. When a transition is detected in the digital signal, the transition detector 205 may output a control signal to the leg control circuits 215, 220, to cause an appropriate response in the pull-up circuit 225 and pull-down circuit 230. For example, when the transition detector 205 detects that the digital signal transitions from logic high to logic low, each leg of the pull-up circuit 225 may be deactivated, while, concurrently, each leg of the pull-down circuit 230 may be activated. Thus, when the digital signal transitions to logic low, the pull-down circuit 230 may pull an output signal to VSSQ, causing a full amplitude swing. When the transition detector 205 detects that the digital signal transitions from logic low to logic high, each of the legs of the pull-down circuit 230 may be deactivated and each leg of the pull-up circuit 225 may be activated. Thus, when the digital signal transitions from logic high, the pull-up circuit 225 may pull an output signal to VDDQ, also causing a full amplitude swing.

The variable delay circuit 210 may also receive the digital signal to generate a delayed version of the digital signal that has been delayed by a delay interval. The delay interval may be adjustable, based on a delay control signal, and may be less than one bit period. In some embodiments, the delay control signal may be an externally provided control signal, for example, from a memory controller. To generate a delay of less than one bit period, multiple samples of the digital signal at the input may be taken by the variable delay circuit 210, leg control circuits 215, 220, or a combination of variable delay circuit 210 and leg control circuits 215, 220. In some embodiments, the delay interval may be adjusted in discrete steps. In other embodiments, the delay interval may be continuously adjustable, for example, in an analog manner. Moreover, in further embodiments, the delay interval may be adjusted on a bit-by-bit basis, for each individual bit.

The delayed digital signal may be output, by the variable delay circuit 210, to differential adders in the leg control circuits 215, 220, respectively. The digital signal received at the input may also be provided to the respective differential adders of the control circuits 215, 220. The delayed digital signal may, consequently, be subtracted from the digital signal received at the input. Thus, the amount of delay introduced by the variable delay circuit 210 may determine, at least in part, the de-emphasis time for a given bit.

The leg control circuits 215, 220 may each be configured to receive a de-emphasis control signal. In some embodiments, the de-emphasis control signal may be externally provided, for example, by a memory controller. The de-emphasis control signal may be configured to cause the leg control circuits 215, 220 to determine and/or adjust a de-emphasis amplitude. For example, in some embodiments, the de-emphasis amplitude may be set as desired to an amplitude that is less than a reference amplitude. In this context, the reference amplitude may refer to a voltage associated with a full amplitude swing, such as VDDQ and VSSQ. In further embodiments, the de-emphasis control signal may be configured to set the reference amplitude to a desired voltage.

As described previously, when a transition is detected by transition detector 205, the leg control circuits 215, 220 may cause a corresponding full amplitude swing to occur in the pull-up circuit 225 and pull-down circuit 230 for a partial bit period. Then, during the same bit period, the bit may be de-emphasized for a de-emphasis time based on the amount of delay introduced by the variable delay circuit 210. For example, for purposes of illustration, when the delayed digital signal is delayed by 25% of a bit period, the de-emphasis time may be 75% of the bit period. When the delayed digital signal is delayed by 75% of a bit period, the de-emphasis time may be 25% of the bit period. When the delayed digital signal is delayed by 50% of a bit period, the de-emphasis time may be 50% of the bit period.

Thus, after a delay interval has elapsed from a transition between logic low to logic high, or logic high to logic low, the leg control circuits 215, 220 may cause the bit to be de-emphasized. For example, in some embodiments, after the delay interval has elapsed from a first transition from logic low to logic high, one or more legs in the pull-down circuit 230 may be activated, while a corresponding number of one or more legs of the pull-up circuit 225 may be deactivated. Correspondingly, after a delay interval has elapsed from a second transition from logic high to logic low, one or more legs of the pull-up circuit 225 may be activated while a corresponding number of one or more legs of the pull-down circuit 230 may be deactivated. The number of legs activated and/or deactivated may be based on the desired de-emphasis amplitude, and based at least in part on the de-emphasis control signal. When a subsequent bit is a repeated bit, and not a transition, the de-emphasis amplitude may be maintained by the pull-up and pull-down circuits 225, 230. In some embodiments, the de-emphasis amplitude may correspond to the amplitude of the digital signal after the delay interval. The digital signal may not fully reach the reference amplitude over the duration of the delay interval due to the slew rate of the output driver 240. Thus, the de-emphasis amplitude may be set to match an intermediate amplitude that the digital signal is expected to reach when driven to the reference amplitude after the delay interval.

In some embodiments, on a conceptual level, the leg control circuits 215, 220 may be considered to combine the digital signal and the delayed digital signal to produce the de-emphasized output signal, or control signals for controlling the pull-up and pull-down circuits 225, 230. In some embodiments, combining may include adding or subtracting the signals. For instance, in some embodiments, the leg control circuit may generate a first intermediate signal multiplying the magnitude of the digital signal by a first factor, and generate a second intermediate signal by multiplying the magnitude of the delayed digital signal by a second factor. In some embodiments, the first or second factors may be positive or negative, and the absolute value of the first and second factors may add up to 1. Accordingly, as previously discussed, the first and second factors may correspond to a full amplitude when the signals are combined additively (for example both signals corresponding to a logic high or logic low), and to a de-emphasis amplitude when the signals are combined differentially (for example, when one signal corresponds to a logic high and the other signal corresponds to a logic low).

The pull-up and pull-down circuits 225, 230 may be matched, or have the same number of legs. Thus, constant output impedance may be maintained by the output driver 240. Moreover, embodiments provide symmetric de-emphasis by the output driver 240, even when the output signal is terminated to VDDQ or VSSQ. By providing adjustability to the de-emphasis time, the bandwidth of the equalizer circuit may also be adjusted. Higher bandwidth generally corresponds to a higher slew rate and lower amplitude. In some embodiments, receivers of the de-emphasized digital signal (e.g., output signal) may require an amplifier or additional gain.

Figure 3:
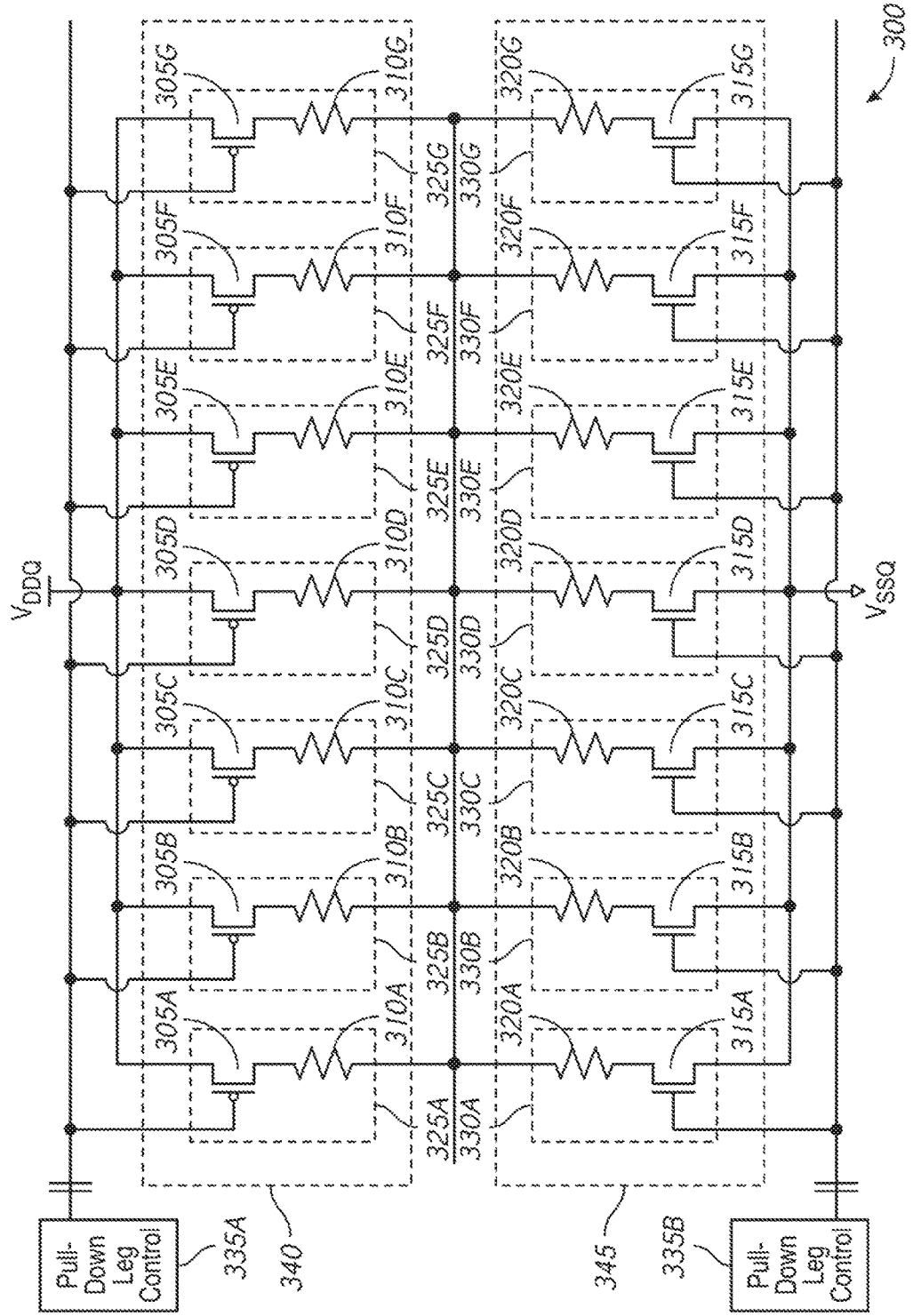
FIG. 3 is a schematic circuit diagram of the legs of the pull-up/pull-down circuit of the output driver, in accordance with various embodiments

FIG. 3 illustrates a schematic circuit diagram of a pull-up/pull-down circuit 300, in accordance with various embodiments. The pull-up legs 325A-325G (collectively 325) may correspond to the pull-up circuit 225 of output driver 240, whereas the pull-down legs 330A-330G (collectively 330) may correspond to the pull-down circuit 230 of the output driver 240. Each of the pull-up legs 325 may respectively include a pull-up resistor 310A-310G (collectively 310) coupled to VDDQ via switches 305A-305G (collectively 305). Each of the pull-down legs 330 may respectively include a pull-down resistor 320A-320G (collectively 320) coupled to VSSQ via switches 315A-315G (collectively 315). In some embodiments, switches 305 and switches 315 may be complementary transistors. For example, the gates of the switches 305 may be coupled to a pull-up leg control circuit 335A, and the gates of the switches 315 may be couple to a pull-down leg control circuit 335B. The pull-up leg control circuit 335A may be configured to individually control each switch 305 for each respective pull-up leg 325. The pull-down leg control circuit 335B may similarly be configured to individually control each switch 315 for each respective pull-down leg 330. The pull-up leg control circuit 335A and pull-down leg control circuit 335B (collectively leg control circuits 335) may correspond to the leg control circuits 215, 220 of de-emphasis control circuit 235 in FIG. 2.

In various embodiments, a de-emphasis control circuit 235 may be configured to receive a digital signal at an input, and each of the leg control circuits 335 may be configured to individually and/or collectively control both the pull-up legs 325 of pull-up circuit 340 and pull-down legs 330 of pull-down circuit 345. As previously described with respect to FIG. 2, the de-emphasis time for partial bit de-emphasis may be determined by the de-emphasis control circuit 235 via an adjustable delay interval. In the illustrated embodiments, seven pull-up legs 325 and seven pull-down legs 330 are provided by way of example only and is not be considered limiting. It is to be understood that in other embodiments, additional or fewer legs 325, 330 may be utilized.

In various embodiments, the pull-up leg control circuit 335A and pull-down leg control circuit 335B may cause one or more pull-up legs 325, and one or more pull-down legs 330 respectively, to be activated or deactivated to provide, at the output, a signal with partial bit de-emphasis. In some embodiments, based on control signals provided to a de-emphasis control circuit, for example, by a memory controller, the leg control circuits 335 may control when to activate and deactivate respective pull-up legs 325 and pull-down legs 330, and the number of pull-up legs 325 and pull-down legs 330 to activate and deactivate, respectively. For example, by controlling when a pull-up leg 325 is activated (or deactivated) and corresponding pull-down leg 330 is deactivated (or activated), the leg control circuits 335 may determine a de-emphasis time of the signal. Moreover, by controlling the number of pull-up legs 325 activated (or deactivated), and corresponding number of pull-down legs 330 deactivated (or activated), the leg control circuits 335 may determine a de-emphasis amplitude. This will be discussed in greater detail below with respect to FIGS. 5 & 6.

Figure 4:
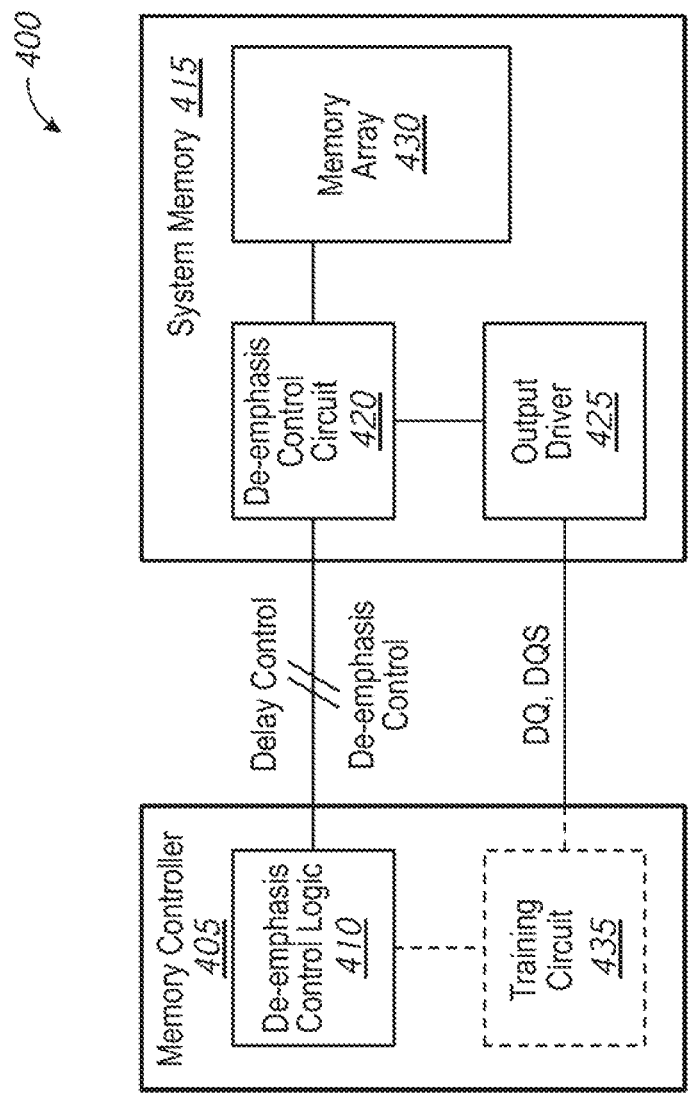
FIG. 4 is a schematic block diagram of a system for partial bit de-emphasis in a memory device, in accordance with various embodiments.

FIG. 4 illustrates a schematic block diagram of a system 400 for partial bit de-emphasis in a memory device, in accordance with various embodiments. The system 400 may include a memory controller 405 coupled to system memory 415. The memory controller 405 may include de-emphasis control logic 410. System memory 415 may include a de-emphasis control circuit 420 that is configured to receive de-emphasis controls signals, as previously described, from the de-emphasis control logic 410. De-emphasis control circuit 420 may further be configured to receive data (DQ) from memory array 430. DQ may include digital data to be equalized by the de-emphasis control circuit 420, before being output, via the output driver 425, externally, for example to the memory controller 405. De-emphasis control circuit 420 may be coupled to the output driver 425. In some embodiments, output driver 425 may include, without limitation, push-pull voltage drivers, as previously described in FIG. 3. The output driver 425 may in turn be configured to output and equalized digital signal to the memory controller 405.

As previously described, the de-emphasis time for partial bit de-emphasis may be controlled via external control signals, such as those generated by the de-emphasis control logic 410. This may include adjustment of the de-emphasis time, as well as de-emphasis amplitude. Memory controller 405 may include an external controller, such as a processor, to control partial bit de-emphasis operations.

In some embodiments, memory controller 405 may optionally include a training circuit 435. The training circuit 435 may be configured to perform various training and calibration functions, as known to those skilled in the art. For example, in some embodiments, the training circuit 435 may be configured to perform, without limitation, data eye optimization, reference voltage (amplitude) calibration, and read data training. In some embodiments, the training circuit 435 may also optionally be connected to de-emphasis control logic 410. Accordingly, in some embodiments, one or more of the delay control signal and de-emphasis control signal may be adjusted based on input from the training circuit 435, such as, for example, in data eye optimization. In further embodiments, data eye optimization may include first identifying a de-emphasis amplitude providing the best data eye for a given channel, such as, without limitation, a data path for data in the memory array. After an optimal de-emphasis amplitude has been determined, the training circuit 435 may proceed to determine a de-emphasis time (e.g. partial bit period) with the optimal data eye characteristics.

In further embodiments, the training circuit 435 may further perform reference voltage calibration and read data training, as known to those in the art, using a signal with the previously determined de-emphasis amplitude and/or de-emphasis time with the optimal data eye characteristics. In some embodiments, read training may enable a controller to find the data eye center and burst frame location for an output signal from the output driver 425. In some embodiments, read training may align the data bus to a write clock (WCK) signal. This may include two parts: 1) aligning the latching clock in the memory controller to the center of a read data bit; and 2) detecting burst boundaries out of a continuous read data stream. In further embodiments, a read buffer may be utilized to function as temporary storage for read data. The read buffer may be preloaded with test data that may be transmitted over a previous trained address bus. Once read buffer is loaded with test data, a read command may be issued by the controller repeatedly. The controller may then sweep its clock phase until the data is correctly sampled. Reference voltage calibration may include calibration of an internally generated reference voltage ($V_{REFDQ}$) for a digital signal. In general, the goal of reference voltage calibration may be to calibrate $V_{REFDQ}$ to a theoretical ideal mid-point voltage of the DQ signal. For example, this may correspond to Mid of the output signal in FIG. 5.

Figure 5:
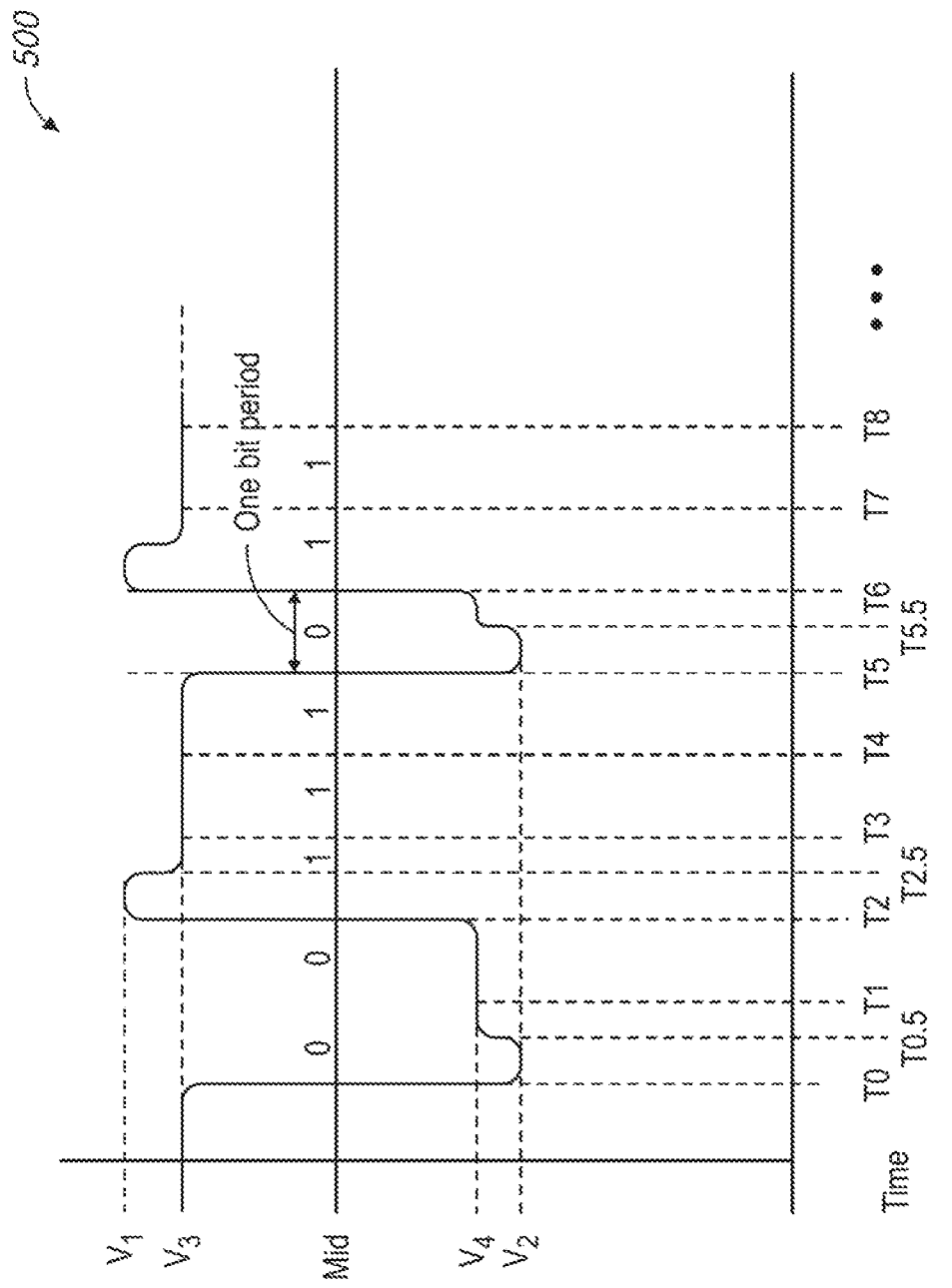
FIG. 5 is a timing diagram of a digital signal with partial bit de-emphasis, in accordance with various embodiments.

FIG. 5 is a timing diagram of a digital signal 500 with partial bit de-emphasis, in accordance with various embodiments. As in FIG. 1, at times T0, T1, T2, T3, T4, T5, T6, T7, and T8 each correspond to consecutive bit periods. In the depicted embodiments, V1 corresponds to a full amplitude logic high, V2 corresponds to a full amplitude logic low, V3 corresponds to a de-emphasis amplitude on a repeated logic high bit, and V4 corresponds to a de-emphasis amplitude on a repeated logic low bit. For example, in some embodiments, V1 may correspond to VDDQ and V2 may correspond to VSSQ. In further embodiments, V3 and V4 may correspond to a desired de-emphasis amplitude, such as, without limitation, 0.5 VDDQ and 0.5 VSSQ, respectively. In other embodiments, different de-emphasis amplitudes may be utilized, based at least in part on the de-emphasis time. As previously described, in some embodiments, the de-emphasis time may be determined by a delay interval introduced by a variable delay circuit.

In the embodiments depicted, the digital signal transitions from logic high, at an amplitude of V3, to logic low at time T0. Because the digital signal transitions at T0, the signal has an amplitude of V2 for a duration of half a bit period. As shown at time T0.5, the signal is then de-emphasized to an amplitude of V4. At time T1, a logic low is repeated at the signal, and an amplitude of V4 is maintained. At time T2, the signal undergoes another transition, from logic low to logic high. Accordingly, the signal has a full amplitude of V1. After another half bit period, at time T2.5, the signal goes to the de-emphasis amplitude V3. Logic high is repeated for an additional two bits, from time T3 to time T5. Thus, the signal remains at de-emphasis amplitude V3 for an additional two bit periods. At time T5, the signal then transitions back to logic low. Accordingly, at time T5, the signal undergoes a full-amplitude swing to V2. Then, after another half bit period, at T5.5, the signal becomes de-emphasized once again to an amplitude of V4 until the signal transitions once again at time T6.

Accordingly, the signal may have partial bit de-emphasis, where the signal has a de-emphasis time of a half bit period. In some embodiments, delay interval of a half bit period may be utilized to produce a half bit period de-emphasis. For example, as previously described, a variable delay circuit may be utilized to produce a delayed version of the digital signal. The delayed version of the digital signal may be subtracted from the received digital signal to produce a partial bit de-emphasis in an output signal. Thus, the variable delay circuit may be configured to produce a half bit period delayed digital signal, which may in turn be subtracted from the digital signal, to produce a de-emphasized digital signal (e.g., output signal) with a partial bit de-emphasis of half a bit period.

Figure 6:
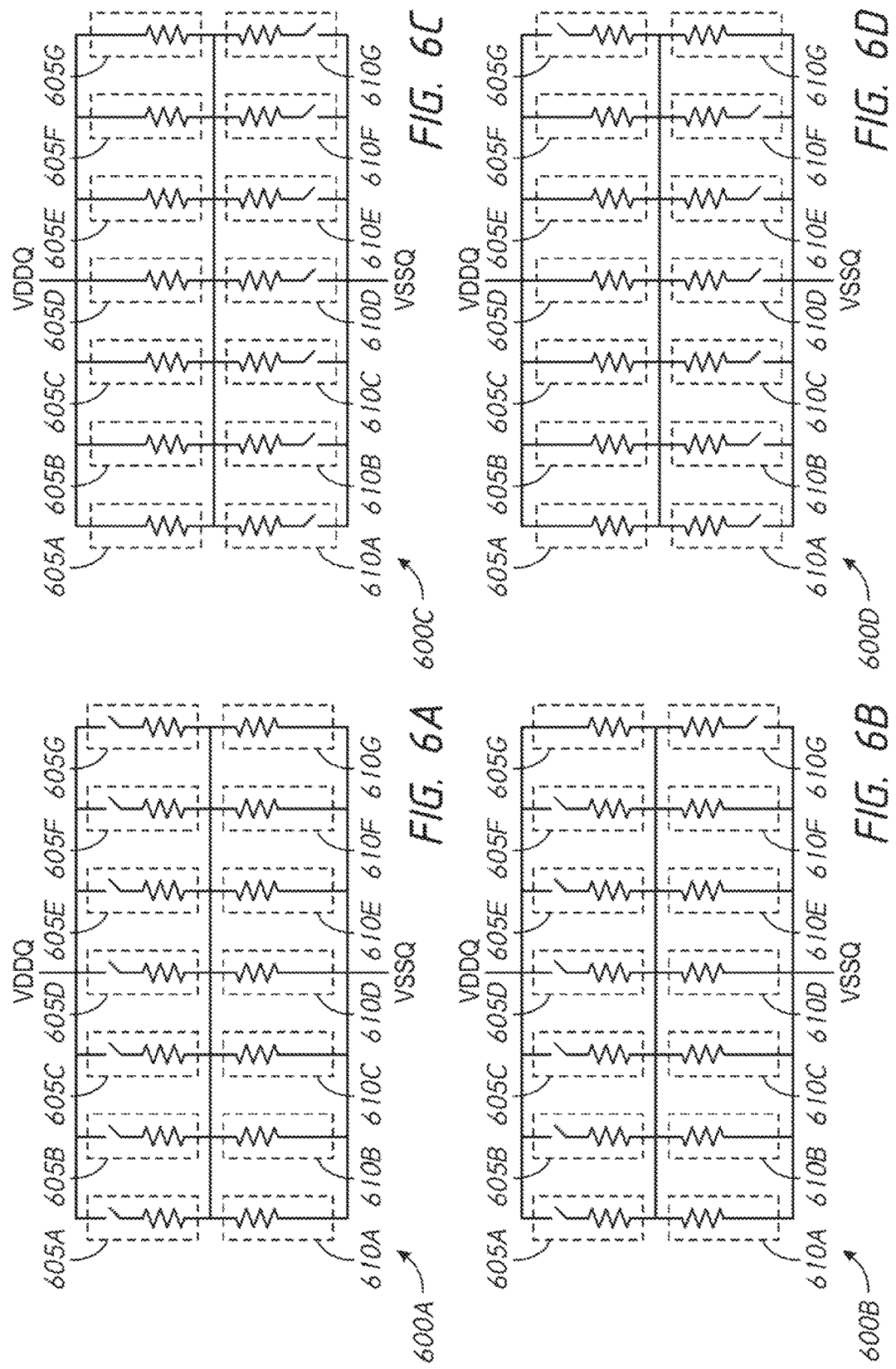
FIG. 6A is a schematic diagram of the legs of a pull-up/pull-down circuit of the output driver in a first example state, in accordance with various embodiments.
FIG. 6B is a schematic diagram of the legs of a pull-up/pull-down circuit of the output driver in a second example state, in accordance with various embodiments.
FIG. 6C is a schematic diagram of the legs of a pull-up/pull-down circuit of the output driver in a third example state, in accordance with various embodiments.
FIG. 6D is a schematic diagram of the legs of a pull-up/pull-down circuit of the output driver in a fourth example state, in accordance with various embodiments.

FIG. 6 is a schematic diagram of the legs of a pull-up/pull-down circuit of the output driver in four example states 600A-600D, according to various embodiments. Each pull-up/pull-down circuit 600A-600D respectively includes seven pull-up legs 605A-605G (collectively 605), and seven pull-down legs 610A-610G (collectively 610). As previously described with respect to FIG. 3, each of the pull-up legs 605 may include a respective pull-up resistor and switch, and each of the pull-down legs 610 may include a respective pull-down resistor and switch.

In a first state 600A, each of the pull-up legs 605 may be deactivated (e.g., switches open) while each of the pull-down legs 610 may be activated (e.g., switches closed). With reference to FIG. 5, this may correspond to the full amplitude logic low, depicted at T0 to T0.5, and T5 to T5.5. Thus, the output driver may be in the first state 600A while outputting a signal with a full amplitude logic low. After the de-emphasis time (e.g. the partial bit period) has elapsed, the signal may be de-emphasized, for example at T0.5 and T5.5.

To perform the de-emphasis, the output driver may enter the second state 600B. In the second state 600B, pull-up leg 605G, which was previously deactivated, may be activated (e.g., switch closed). Correspondingly, pull-down leg 610G, which was previously activated, may be deactivated (e.g., switch opened). In this manner, the signal at the output may be de-emphasized while maintaining constant driver impedance. Accordingly, the output driver may be in the second state 600B when a de-emphasized logic low, (e.g., V4 of FIG. 5) is desired to be output, for example, from T0.5 to T2, and T5.5 to T6.

Similarly, to the first state 600A, the third state 600C may correspond to a full amplitude logic high. Accordingly, each of the pull-up legs may be activated (e.g., switches closed), and each of the pull-down legs may be deactivated (e.g., switches opened). With reference to FIG. 5, this may correspond to V1 at T2 to T2.5, and T6. Thus, the output driver may be in the third state 600C while outputting a signal with a full amplitude logic high.

Similar to the second state 600B, the output driver may enter the fourth state 600D to produce a de-emphasized logic high (e.g., V3 of FIG. 5). In the fourth state 600D, pull-up leg 605G, which was previously activated, may be deactivated (e.g., switch opened). Corresponding pull-down leg 610G, which was previously deactivated, may be activated (e.g., switch closed). Accordingly, the output driver may be in the fourth state 600D when a de-emphasized logic high, (e.g., V3 of FIG. 5) is desired to be output, for example, from T2.5 to T5.

It is to be understood that the number of legs activated and/or deactivated, and the specific leg activated and/or deactivated, in the various states 600A-600D are used for purposes of explanation only and should not be taken as limiting. For example, it will be appreciated that in other embodiments, the states 600A-600D may have a different number of legs activated and/or deactivated (e.g., two or more legs). Moreover, it is to be understood that the number of pull-up legs 605 and pull-down legs 610 should not be taken as limited to seven legs. In other embodiments, a different number of legs may be utilized as required, (e.g., fewer than seven, greater than seven).

Figure 7:
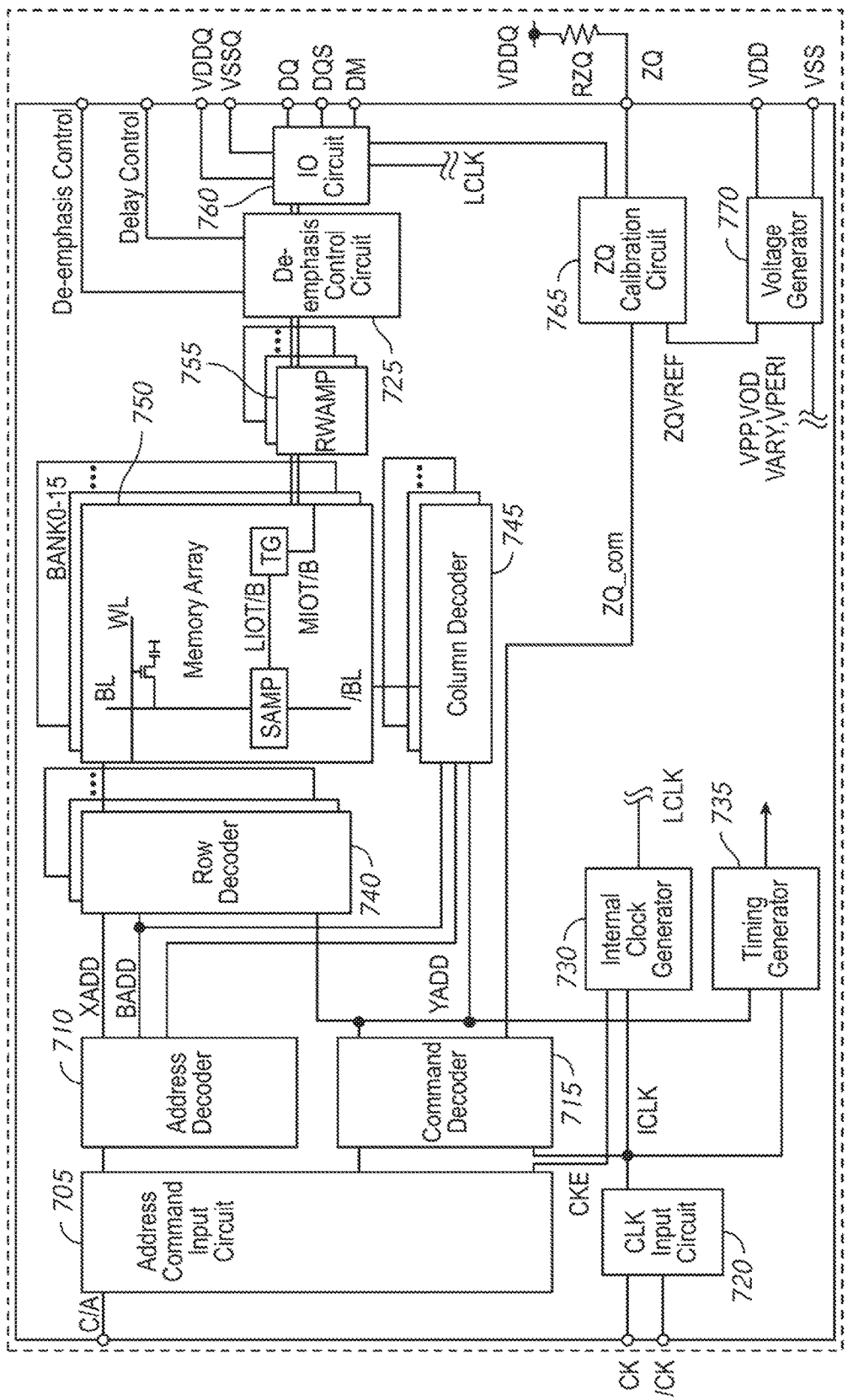
FIG. 7 is a schematic diagram of a semiconductor device configured for partial bit de-emphasis, in accordance with various embodiments.

FIG. 7 is a schematic diagram of a semiconductor device 700, according to various embodiments. The semiconductor device 700 includes a memory die. The memory die may include an address/command input circuit 705, address decoder 710, command decoder 715, clock input circuit 720, internal clock generator 730, timing generator 735, row decoder 740, column decoder 745, memory arrays 750, read/write amplifiers 755, de-emphasis control circuit 725, I/O circuit 760, ZQ calibration circuit 765, and voltage generator 770.

In some embodiments, the semiconductor device 700 may include, without limitation, a DRAM device, such as a DDR3 or DDR4 device integrated into a single semiconductor chip, for example. The die may be mounted on an external substrate, for example, a memory module substrate, a mother board or the like. The semiconductor device 700 may further include a memory array 750. The memory array 750 includes a plurality of banks, each bank including a plurality of word lines WL, a plurality of bit lines BL, and a plurality of memory cells MC arranged at intersections of the plurality of word lines WL and the plurality of bit lines BL. The selection of the word line WL is performed by a row decoder 740 and the selection of the bit line BL is performed by a column decoder 745. Sense amplifiers (SA) are located for their corresponding bit lines BL and connected to at least one respective local I/O line, which is in turn coupled to a respective one of at least two main I/O line pairs, via transfer gates (TG), which function as switches.

The semiconductor device 700 may employ a plurality of external terminals that include address and command terminals coupled to command/address bus (C/A), clock terminals CK and/CK, data terminals DQ, DQS, and DM, power supply terminals VDD, VSS, VDDQ, and VSSQ, and the ZQ calibration terminal (ZQ).

The command/address terminals may be supplied with an address signal and a bank address signal from outside. The address signal and the bank address signal supplied to the address terminals are transferred, via the address/command input circuit 705, to an address decoder 710. The address decoder 710 receives the address signal and supplies a decoded row address signal to the row decoder 740, and a decoded column address signal to the column decoder 745. The address decoder 710 also receives the bank address signal and supplies the bank address signal to the row decoder 740, the column decoder 745.

The command/address terminals may further be supplied with a command signal from outside, such as, for example, a memory controller 705. The command signal may be provided, via the C/A bus, to the command decoder 715 via the address/command input circuit 705. The command decoder 715 decodes the command signal to generate various internal commands that include a row command signal to select a word line and a column command signal, such as a read command or a write command, to select a bit line, and a test mode signal. The test mode signal may be provided to a test mode circuit 725, which will be discussed in greater detail below.

Accordingly, when a read command is issued and a row address and a column address are timely supplied with the read command, read data is read from a memory cell in the memory array 750 designated by these row address and column address. The read data DQ is output to the outside from the data terminals DQ, DQS, and DM via read/write amplifiers 755, de-emphasis control circuit 725, and an input/output circuit 760. Similarly, when the write command is issued and a row address and a column address are timely supplied with this command, and then write data is supplied to the data terminals DQ, DQS, DM, the write data is received by data receivers in the input/output circuit 760, and supplied via the input/output circuit 760 and the read/write amplifiers 755 to the memory array 750 and written in the memory cell designated by the row address and the column address.

When read data DQ is output from the memory array 750 by the read/write amplifiers 755, the data has not yet undergone partial bit de-emphasis. Accordingly, the read data may be provided by the read/write amplifiers 755 to the de-emphasis control circuit 725. As previously described, de-emphasis control circuit 725 may then perform partial bit de-emphasis of the read data DQ signal. The partial bit de-emphasis may be controlled according to control signals, including a de-emphasis control signal and delay control signal. The de-emphasis control circuit 725 may then, according to the control signals, control operation of an output driver. Accordingly, in some embodiments, the input/output circuit 760 may include all or part of an output driver, as described with respect to the above embodiments.

Turning to the explanation of the external terminals included in the semiconductor device 700, the clock terminals CK and /CK are supplied with an external clock signal and a complementary external clock signal, respectively. The external clock signals (including complementary external clock signal) may be supplied to a clock input circuit 705. The clock input circuit 705 may receive the external clock signals to generate an internal clock signal ICLK. The internal clock signal ICLK is supplied to an internal clock generator 730 and thus a phase controlled internal clock signal LCLK is generated based on the received internal clock signal ICLK and a clock enable signal CKE from the address/command input circuit 705. Although not limited thereto, a DLL circuit can be used as the internal clock generator 730. The phase controlled internal clock signal LCLK is supplied to the input/output circuit 760 and is used as a timing signal for determining an output timing of read data. The internal clock signal ICLK is also supplied to a timing generator 735 and thus various internal clock signals can be generated.

The power supply terminals are supplied with power supply potentials VDD and VSS. These power supply potentials VDD and VSS are supplied to an internal voltage generator circuit 770. The internal voltage generator circuit 770 generates various internal potentials VPP, VOD, VARY, VPERI, and the like and a reference potential ZQVREF based on the power supply potentials VDD and VSS. The internal potential VPP is mainly used in the row decoder 740, the internal potentials VOD and VARY are mainly used in the sense amplifiers included in the memory array 750, and the internal potential VPERI is used in many other circuit blocks. The reference potential ZQVREF is used in the ZQ calibration circuit 765.

The power supply terminals are also supplied with power supply potentials VDDQ and VSSQ. These power supply potentials VDDQ and VSSQ are supplied to the input/output circuit 760. The power supply potentials VDDQ and VSSQ are the same potentials as the power supply potentials VDD and VSS, respectively. However, the dedicated power supply potentials VDDQ and VSSQ are used for the input/output circuit 760 so that power supply noise generated by the input/output circuit 760 does not propagate to the other circuit blocks.

The calibration terminal ZQ is connected to the ZQ calibration circuit 765. The ZQ calibration circuit 765 performs a calibration operation with reference to an impedance of RZQ, and the reference potential ZQVREF, when activated by the ZQ calibration command signal (ZQ_com). An impedance code ZQCODE obtained by the calibration operation is supplied to the input/output circuit 760, and thus an impedance of an output buffer (not shown) included in the input/output circuit 760 is specified.

While certain features and aspects have been described with respect to exemplary embodiments, one skilled in the an will recognize that various modifications and additions can be made to the embodiments discussed without departing from the scope of the invention. Although the embodiments described above refer to particular features, the scope of this invention also includes embodiments having different combination of features and embodiments that do not include all of the above described features. For example, the methods and processes described herein may be implemented using hardware components, software components, and/or any combination thereof. Further, while various methods and processes described herein may be described with respect to particular structural and/or functional components for ease of description, methods provided by various embodiments are not limited to any particular structural and/or functional architecture, but instead can be implemented on any suitable hardware, firmware, and/or software configuration. Similarly, while certain functionality is ascribed to certain system components, unless the context dictates otherwise, this functionality can be distributed among various other system components in accordance with the several embodiments.

Moreover, while the procedures of the methods and processes described herein are described in a particular order for ease of description, various procedures may be reordered, added, and/or omitted in accordance with various embodiments. The procedures described with respect to one method or process may be incorporated within other described methods or processes; likewise, hardware components described according to a particular structural architecture and/or with respect to one system may be organized in alternative structural architectures and/or incorporated within other described systems. Hence, while various embodiments are described with or without certain features for ease of description, the various components and/or features described herein with respect to a particular embodiment can be combined, substituted, added, and/or subtracted from among other described embodiments. Consequently, although several exemplary embodiments are described above, it will be appreciated that the invention is intended to cover all modifications and equivalents within the scope of the following claims.

What is claimed is:

1. An apparatus comprising:
an external terminal; and
an output driver coupled to the external terminal, the output driver configured to:
receive a first signal having a first logical value,
receive a second signal following the first signal, the second signal having a second logical value different from the first logical value, and
drive, in response to receiving the second signal, the external terminal from a first voltage to a second voltage by way of a third voltage, wherein the third voltage is a de-emphasized first voltage based at least in part on a de-emphasis time,
wherein the output driver receives a third signal having the second logical value, wherein the first signal is received following the third signal.

2. The apparatus of claim 1, wherein the output driver de-emphasizes the first voltage for two bit periods.

3. The apparatus of claim 1, further comprising a variable delay circuit to introduce a delay interval; wherein the delay interval determines the de-emphasis time.

4. The apparatus of claim 3, wherein the delay interval comprises a half bit period to produce a half bit period de-emphasis.

5. The apparatus of claim 3, wherein the variable delay circuit is configured to receive an input signal having first and second logic values, and generate a delayed signal that is delayed relative to the input signal by an adjustable delay interval that is less than one bit period.

6. The apparatus of claim 5, wherein the output driver produces a partial bit de-emphasis in an output signal responsive to subtracting the delayed signal from the received input signal.

7. The apparatus of claim 1, wherein the output driver drives, in response to receiving the first signal, the external terminal from the second voltage to the first voltage by way of a fourth voltage, wherein the first voltage is between the second and fourth voltages.

8. The apparatus of claim 7, wherein the output driver includes a plurality of pull-down transistors coupled in parallel between a first voltage node and the external terminal,
wherein each of the plurality of pull-down transistors is controlled to be conductive when the external terminal is driven to the fourth voltage, and
wherein at least one of the plurality of pull-down transistors is controlled to be non-conductive when the external terminal is driven to the first voltage.

9. The apparatus of claim 8, wherein the output driver further includes a plurality of pull-up transistors coupled in parallel between a second voltage node and the external terminal,
wherein each of the plurality of pull-up transistors is controlled to be non-conductive when the external terminal is driven to the fourth voltage,
wherein at least one of the plurality of pull-up transistors is controlled to be conductive when the external terminal is driven to the first voltage.

10. The apparatus of claim 1, wherein the output driver includes a plurality of pull-up transistors coupled in parallel between a first voltage node and the external terminal,
wherein each of the plurality of pull-up transistors is controlled to be conductive when the external terminal is driven to the third voltage, and
wherein at least one of the plurality of pull-up transistors is controlled to be non-conductive when the external terminal is driven to the second voltage.

11. The apparatus of claim 10, wherein the output driver further includes a plurality of pull-down transistors coupled in parallel between a second voltage node and the external terminal,
wherein each of the plurality of pull-down transistors is controlled to be non-conductive the external terminal is driven to the third voltage, and
wherein at least one of the plurality of pull-down transistors is controlled to be conductive when the external terminal is driven to the second voltage.

12. A method comprising:
receiving, at an output driver, a first signal having a first logical value;
receiving, at the output driver, a second signal following the first signal, the second signal having a second logical value different from the first logical value;
driving, in response to receiving the second signal, an external terminal from a first voltage to a second voltage by way of a third voltage, wherein the third voltage is a de-emphasized first voltage based at least in part on a de-emphasis time; and
receiving a third signal having the second logical value, wherein the first signal is received following the third signal.

13. The method of claim 12, wherein driving the external terminal from the first voltage to the second voltage by way of the third voltage comprises de-emphasizing the first voltage for two bit periods.

14. The method of claim 12, further comprising introducing, via a variable delay circuit, a delay interval, wherein the delay interval determines the de-emphasis time.

15. The method of claim 14, wherein introducing the delay interval includes introducing a half bit period to produce a half bit period de-emphasis.

16. The method of claim 14, further comprising receiving, via the variable delay circuit, an input signal having first and second logic values, and generating a delayed signal that is delayed relative to the input signal by an adjustable delay interval that is less than one bit period.

17. The method of claim 16, further comprising subtracting the delayed signal from the received input signal to produce a partial bit de-emphasis in an output signal.

18. The method of claim 12, further comprising driving, in response to receiving the first signal, the external terminal from the second voltage to the first voltage by way of a fourth voltage, wherein the first voltage is between the second and fourth voltages.

19. An apparatus comprising:
an external terminal;
an output driver coupled to the external terminal, the output driver configured to:
receive a first signal having a first logical value,
receive a second signal following the first signal, the second signal having a second logical value different from the first logical value, and
drive, in response to receiving the second signal, the external terminal from a first voltage to a second voltage by way of a third voltage, wherein the third voltage is a de-emphasized first voltage based at least in part on a de-emphasis time; and a variable delay circuit to introduce a delay interval comprising a half bit period to produce a half bit period de-emphasis, the delay interval determines the de-emphasis time.

20. An apparatus comprising:

an external terminal;

an output driver coupled to the external terminal, the output driver configured to:

receive a first signal having a first logical value, receive a second signal following the first signal, the second signal having a second logical value different from the first logical value, and drive, in response to receiving the second signal, the external terminal from a first voltage to a second voltage by way of a third voltage; wherein the third voltage is a de-emphasized first voltage based at least in part on a de-emphasis time; and a variable delay circuit to introduce a delay interval, wherein the delay interval determines the de-emphasis time, wherein the variable delay circuit is configured to receive an input signal having first and second logic values, and generate a delayed signal that is delayed relative to the input signal by an adjustable delay interval that is less than one bit period.

21. An apparatus comprising:

an external terminal; and an output driver coupled to the external terminal, the output driver configured to:

receive a first signal having a first logical value, receive a second signal following the first signal, the second signal having a second logical value different from the first logical value, and drive, in response to receiving the second signal, the external terminal from a first voltage to a second voltage by way of a third voltage, wherein the third voltage is a de-emphasized first voltage based at least in part on a de-emphasis time, wherein the output driver includes a plurality of pull-up transistors coupled in parallel between a first voltage node and the external terminal, wherein each of the plurality of pull-up transistors is controlled to be conductive when the external terminal is driven to the third voltage, and wherein at least one of the plurality of pull-up transistors is controlled to be non-conductive when the external terminal is driven to the second voltage.

22. A method comprising:

receiving, at an output driver, a first signal having a first logical value;

receiving, at the output driver, a second signal following the first signal, the second signal having a second logical value different from the first logical value;

driving, in response to receiving the second signal, an external terminal from a first voltage to a second voltage by way of a third voltage, wherein the third voltage is a de-emphasized first voltage based at least in part on a de-emphasis time; and introducing, via a variable delay circuit, a delay interval comprising a half bit period to produce a half bit period de-emphasis the delay interval determines the de-emphasis time.

23. A method comprising:

receiving, at an output driver, a first signal having a first logical value;

receiving, at the output driver, a second signal following the first signal, the second signal having a second logical value different from the first logical value;

driving, in response to receiving the second signal, an external terminal from a first voltage to a second voltage by way of a third voltage, wherein the third voltage is a de-emphasized first voltage based at least in part on a de-emphasis time; and receiving, via a variable delay circuit, an input signal having first and second logic values, and generating a delayed signal that is delayed relative to the input signal by an adjustable delay interval that is less than one bit period.

* * * * *